United States Patent
Yen

(10) Patent No.: US 11,044,828 B2
(45) Date of Patent: Jun. 22, 2021

(54) PROJECTOR

(71) Applicant: Coretronic Corporation, Hsin-Chu (TW)

(72) Inventor: Chun-Lung Yen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/589,064

(22) Filed: Sep. 30, 2019

(65) Prior Publication Data

US 2021/0100132 A1    Apr. 1, 2021

(51) Int. Cl.
*G03B 21/14* (2006.01)
*H05K 7/20* (2006.01)
*G03B 21/16* (2006.01)

(52) U.S. Cl.
CPC ....... *H05K 7/20172* (2013.01); *G03B 21/145* (2013.01); *G03B 21/16* (2013.01)

(58) Field of Classification Search
CPC ...... G03B 21/16; G03B 21/18; G03B 21/145; H05K 7/20172; H05K 7/20145; H05K 7/20572; H05K 7/20581; H04N 9/3141; H04N 9/3144
See application file for complete search history.

(56) References Cited

U.S. PATENT DOCUMENTS

| | | | |
|---|---|---|---|
| 2003/0071975 A1* | 4/2003 | Fujimori | G03B 21/145 353/31 |
| 2006/0237165 A1* | 10/2006 | Mizuguchi | B41J 29/10 165/59 |
| 2008/0246929 A1* | 10/2008 | Mao | G03B 21/16 353/119 |
| 2011/0279789 A1* | 11/2011 | Gishi | G03B 21/16 353/61 |
| 2012/0257965 A1* | 10/2012 | Xia | F04D 29/668 415/213.1 |
| 2013/0050658 A1* | 2/2013 | Morohoshi | G03B 21/16 353/57 |
| 2016/0143183 A1* | 5/2016 | Tanaka | H04N 9/3144 353/61 |
| 2018/0356712 A1* | 12/2018 | Miyazaki | H04N 9/3144 |

FOREIGN PATENT DOCUMENTS

CN     102628455     8/2012

* cited by examiner

*Primary Examiner* — Sultan Chowdhury
(74) *Attorney, Agent, or Firm* — JCIPRNET

(57) ABSTRACT

A projector includes a fan, a fan frame, a first casing, a second casing and a projection lens. The fan is sleeved in the fan frame, wherein the fan frame comprises a first fixing portion having a first through hole, and two slits located at two opposite sides of the first fixing portion, an extension direction of the two slits is parallel to an extension direction of the first through hole, and a length of each of the two slits is greater than a depth of the first through hole. The first casing is fixed to the fan frame, wherein a first screw passes through the first through hole and is fixed to the first casing. The second casing is fixed to the first casing. The projection lens is fixed to the second casing.

12 Claims, 8 Drawing Sheets

PROJECTOR

BACKGROUND

Technical Field

The disclosure relates to a projector, and more particularly to a projector with better vibration proof-function.

Description of Related Art

Heat dissipation is an important topic in projector design field. Generally, fans are arranged in the projector to improve heat dissipation efficiency. However, the quality of projecting image may be affected by fan vibration.

The information disclosed in this "BACKGROUND" section is only for enhancement of understanding of the background of the described technology and therefore it may contain information that does not form the prior art that is already known to a person of ordinary skill in the art. Further, the information disclosed in the "BACKGROUND" section does not mean that one or more problems to be resolved by one or more embodiments of the invention were acknowledged by a person of ordinary skill in the art.

SUMMARY

The disclosure provides a projector with better vibration-proof function.

In order to achieve one, part, or all of the objectives or other objectives, an embodiment of the disclosure provides a projector includes a fan, a fan frame, a first casing, a second casing and a projection lens. The fan is sleeved in the fan frame, wherein the fan frame includes a first fixing portion having a first through hole, and two slits located at two opposite sides of the first fixing portion, an extension direction of the two slits is parallel to an extension direction of the first through hole, and a length of each of the two slits is greater than a depth of the first through hole. The first casing is fixed to the fan frame, wherein a first screw passes through the first through hole and is fixed to the first casing. The second casing is fixed to the first casing. The projection lens is fixed to the second casing.

Based on the above, in an embodiment of the disclosure, the fan is sleeved in the fan frame, the first fixing portion of the fan frame is fixed to the first casing, the first casing is fixed to the second casing, and the projection lens is fixed to the second casing. The two slits are designed to arrange at the two opposite sides of the first fixing portion of the fan frame, and the length of each of the two slits is greater than the depth of the first through hole so as to transmit less vibration of the fan to the first casing.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
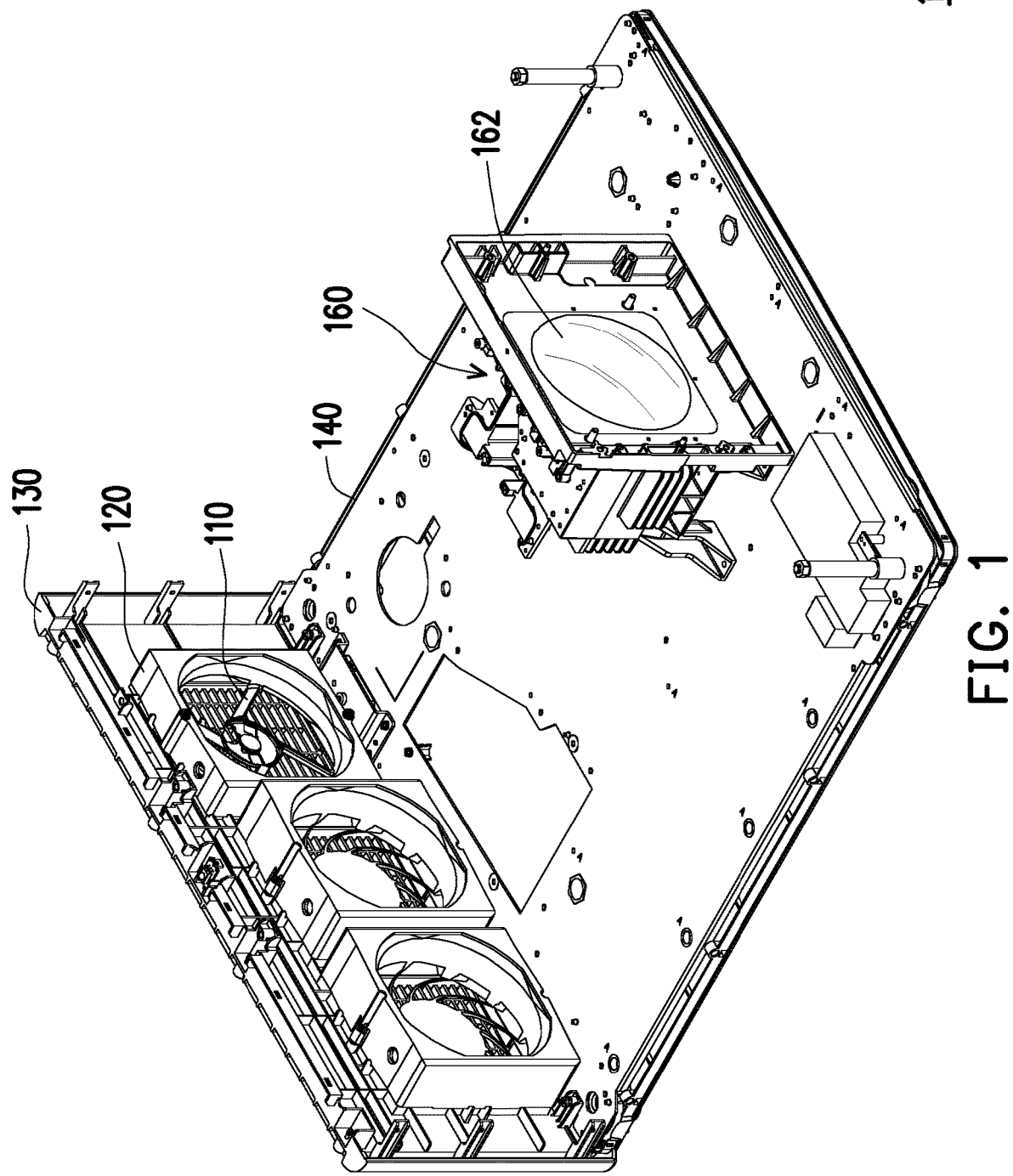
FIG. 1 is a schematic view of a fan, a fan frame, a first casing, a second casing and an optical engine of a projector in accordance with an embodiment of the disclosure.
Figure 2:
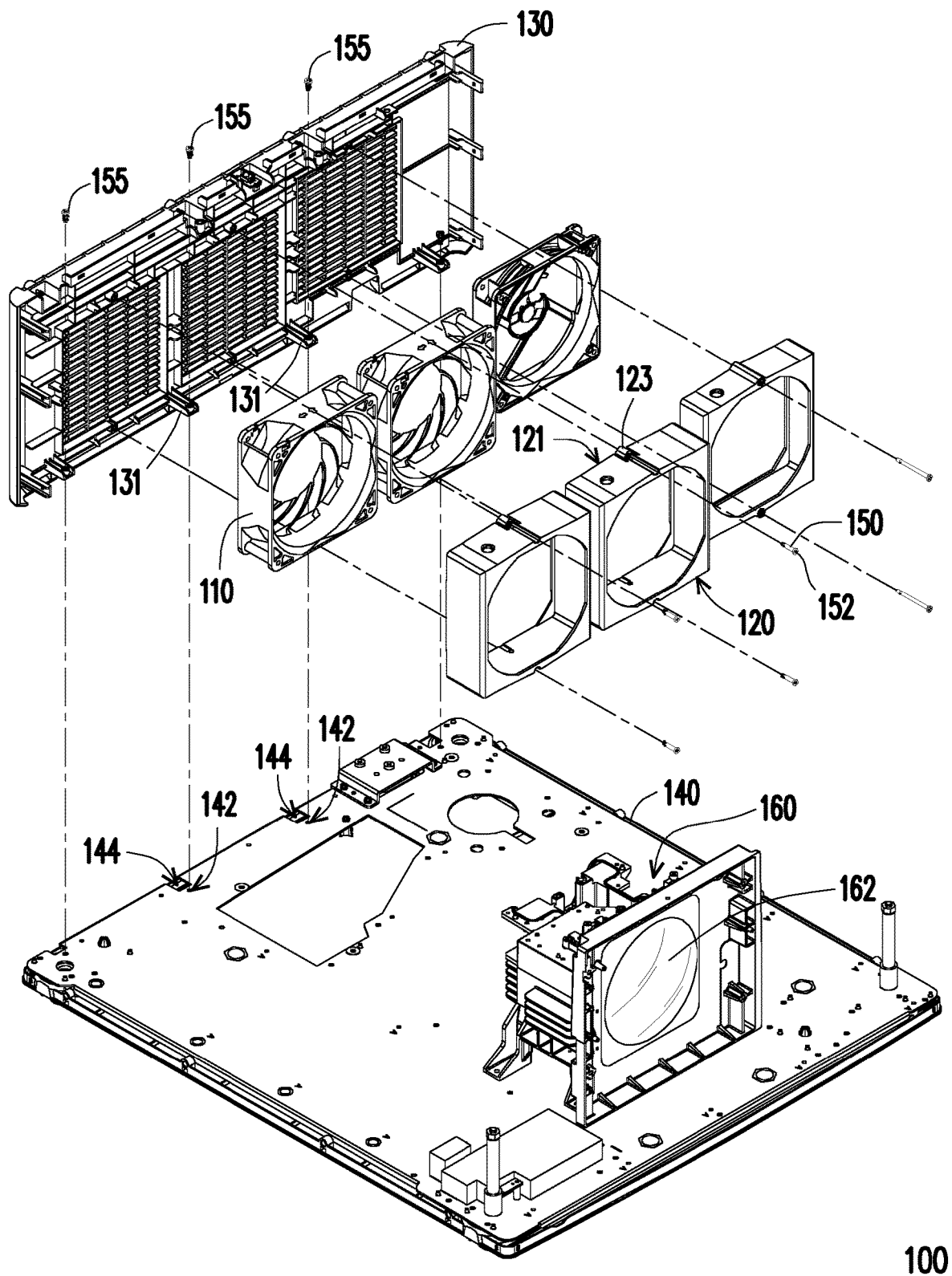
FIG. 2 is an explosive view of the projector of FIG. 1.

FIG. 1 is a schematic view of a fan, a fan frame, a first casing, a second casing and an optical engine of a projector in accordance with an embodiment of the disclosure. FIG. 2 is an explosive view of the projector of FIG. 1. It is noted that only the main components of the disclosure are illustrated in FIGS. 1 and 2, other components of the projector 100 are hidden.

Referring to FIGS. 1 and 2, in the embodiment, the projector 100 includes a fan 110, a fan frame 120, a first casing 130, a second casing 140 and a projection lens 162. The fan 110 is sleeved in the fan frame 120, the second casing 140 is fixed to the first casing 130, and the optical engine 160 connecting the projection lens 162 is fixed to the second casing 140, the projection lens 162 is also fixed to the second casing 140. In the embodiment, the fan frame 120, the first casing 130 and/or the second casing 140 have vibration-proof design such that transmission of vibration from the fan 110 to the projection lens 162 can be reduced, and then transmission of the vibration from the fan 110 to the optical engine 160 can be reduced in the same time. Details are mentioned below. In the embodiments and drawings, only describe a plurality of fans and fans frames. However, the invention does not limit that. One fan and one fan frame of the projection in the other embodiment is also available.

Figure 3:
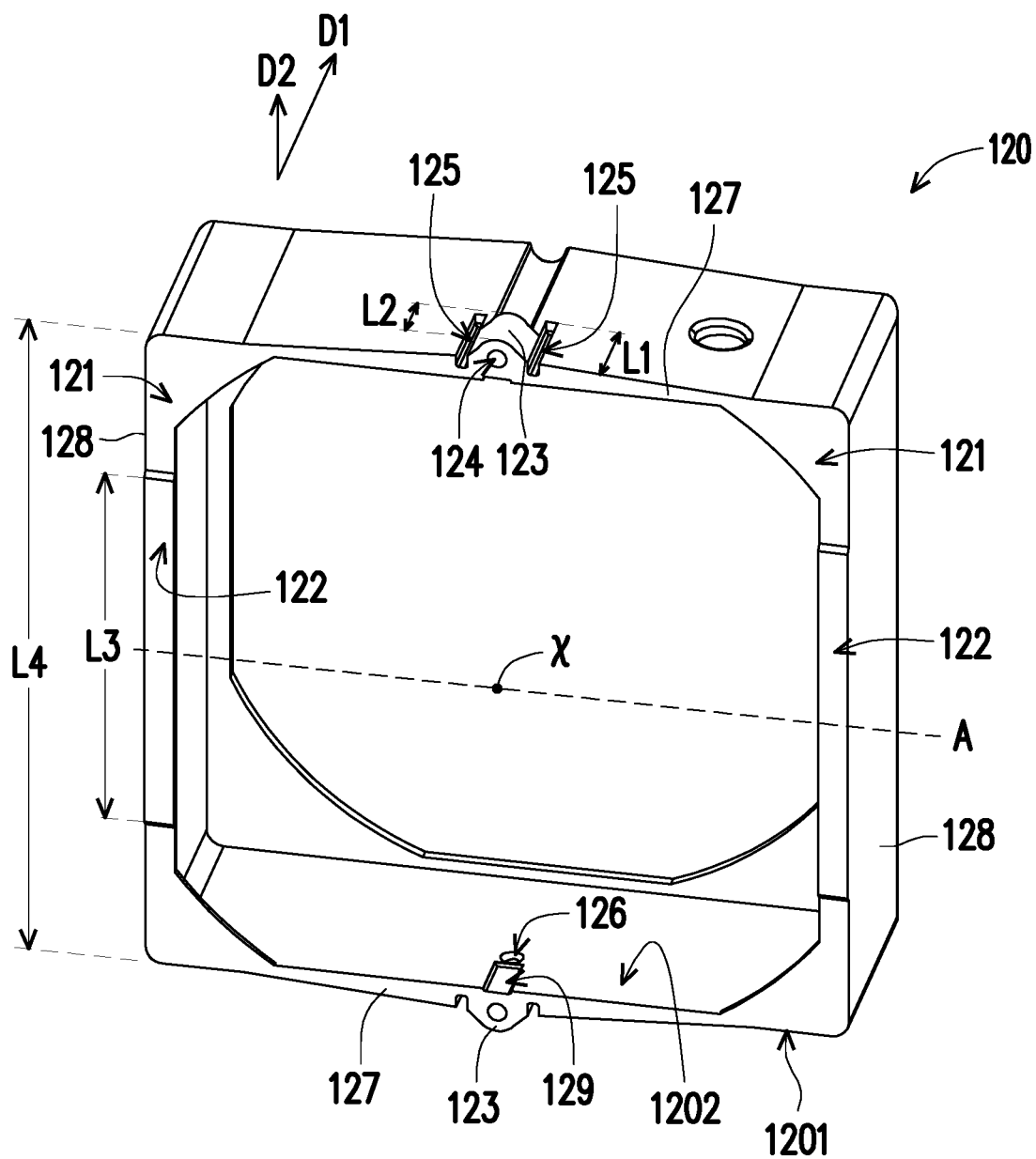
FIGS. 3-5 are schematic views of the fan frame of the projector of FIG. 1 with different angles.
Figure 4:
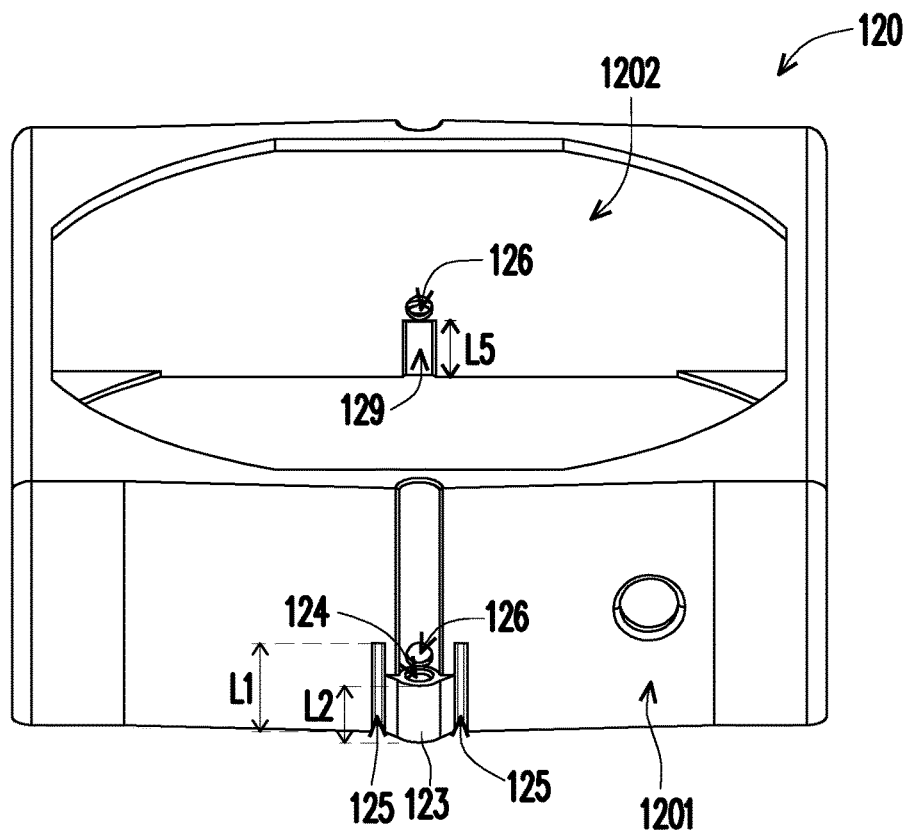
Figure 5:
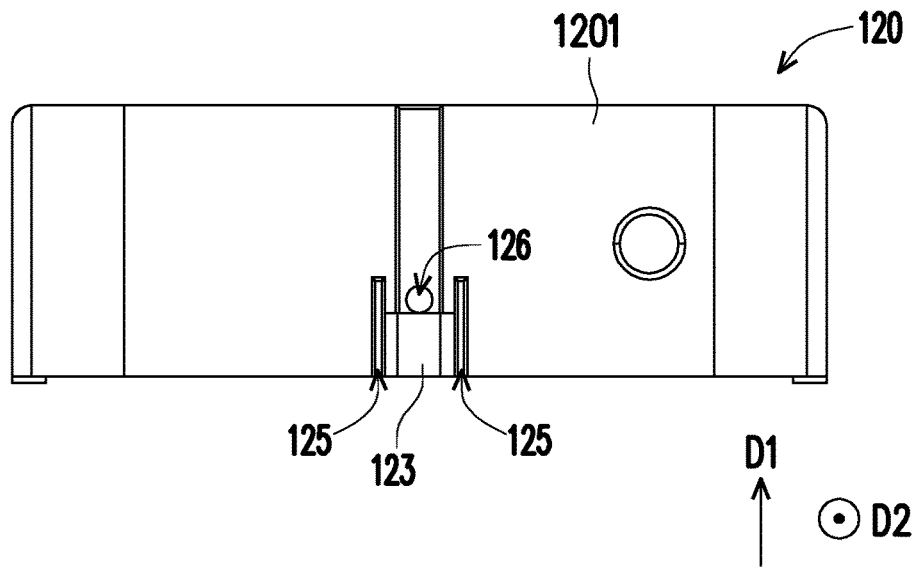

FIGS. 3-5 are schematic views of the fan frame of the projector of FIG. 1 with different angles. Referring to FIGS. 3-5, the fan 110 is adapted to be sleeved around the fan frame 120, and the shape of the fan frame 120 corresponds to the shape of the fan 110. More specifically, in the embodiment, the shape of the fan 110 is quadrilateral, and the fan frame 120 is a hollow quadrilateral cover. Certainly, the shapes of the fan 110 and the fan frame 120 are not limited thereto. In addition, in the embodiment, the fan frame 120 is a flexible fan frame 120, the material of the fan frame 120 may include rubber or silicone so as to sleeve around the fan 110 tightly, but the material of the fan frame 120 is not limited thereto.

In the embodiment, the fan frame 120 includes at least one first fixing portion 123, for example, two first fixing portions 123. In detail, the fan frame 120 includes four lateral walls 127, 128 connected to each other, wherein two opposite lateral walls 127 connect to another two opposite lateral walls 128, so as to form the hollow quadrilateral cover. Furthermore, the fan frame 120 has an outer side 1201 facing the fan 110 and an inner side 1202 opposite thereto after assembling the fan 110 and the fan frame 120. The two first fixing portions 123 are located at two opposite lateral walls 127 of the four lateral walls 127, 128, and protrude from an outer side 1201. Each of the first fixing portions 123 has a first through hole 124. Two first screw 150 pass through the two first through holes 124 and are fixed to the first casing 130, such that the fan frame 120 is fixed to the first casing 130.

In the embodiment, each of the two opposite lateral walls 127 of the fan frame 120 includes two slits 125 (such as two grooves) located at two opposite sides of the first fixing portion 123. As shown in FIGS. 3 and 4, an extension direction of the two slits 125 (as shown in the direction D1 of the FIGS. 3 and 5) is parallel to the extension direction of the first through hole 124 (as shown in the direction D1 of the FIGS. 3 and 5), and a length L1 of each of the two slits 125 is greater than a depth L2 of the first through hole 124. Due to the two slits 125, linkage between the first fixing portion 123 and other portion of the lateral wall 127 may be reduced, such that the fan frame 120 is capable of transmitting less vibration from the fan 110 to the first casing 130.

Moreover, as shown in FIGS. 4 and 5, in the embodiment, each of the lateral walls 127 of the fan frame 120 has a second through hole 126 located beside the first through hole 124 and corresponding to a screw head 152 (shown in FIG. 2) of the first screw 150, and an extension direction of the depth direction of the second through hole 126 (as shown in the direction D2 of the FIGS. 3 and 5) is vertical to the extension direction of the depth direction of the first through hole 124 (as shown in the direction D1 of the FIGS. 3 and 5). The design of the second through hole 126 may reduce the connection between the fan frame 120 and the screw head 152 of the first screw 150 so as to reduce transmission of vibration form the fan to the first casing 130 by the first screw 150. In other words, transmission of vibration from the fan frame 120 to the screw head 152 of the first screw 150 can be lowered, and then transmission of the vibration from the fan 110 to the optical engine 160 can be lower.

Referring to FIGS. 2 and 3, in the embodiment, the fan frame 120 has a first surface 121 facing the first casing 130 and contacting between the outer side 1201 and the inner side 1202, and then the first surface 121 partially contacts the first casing 130 after assembling the fan frame 120 and the first casing 130. More specifically, the fan frame 120 has at least one first protrusion 122, for example two first protrusions 122, protruding from the first surface 121. In the embodiment, the two first protrusions 122 are located at the lateral walls 128, such that the two first protrusions 122 located at the lateral walls 128 are away from the first fixing portion 123 located at the lateral walls 127. When the fan frame 120 is fixed to the first casing 130, the two first protrusions 122 of the fan frame 120 contact and abut against the first casing 130 so that the relative positions of the fan frame 120 and the first casing 130 are fixed.

In the embodiment, the first surface 121 of the fan frame 120 partially contacts the first casing 130. That is, only the two first protrusions 122 of the fan frame 120 contact the first casing 130. Comparing to the conventional structure whose fan frame contacting the first casing by using the whole surface, in the embodiment, the contact area between the fan frame 120 and the first casing 130 can be reduced. Therefore, transmission of vibration from the fan frame 120 to the first casing 130 also can be reduced, and then transmission of the vibration from the fan 110 to the optical engine 160 can be lower.

It is worth to mention that, in the embodiment, as shown in FIG. 3, the fan frame 120 has a center X, an axis A passes through the center X and middle portions of the first protrusions 122. In the embodiment, the shape of the first protrusions 122 is strip, the first protrusions 122 extend from the axis A toward the lateral walls 127. In other embodiment, the shape of the first protrusions 122 may be dot or irregular shape, location, arrangement and/or shape of the first protrusions 122 are not limited thereto.

In the embodiment, a length L3 of the first protrusion 122 is less than a length L4 of the lateral wall where the first protrusion 122 is located, for example, the length L3 of the first protrustion 122 is less than a length L4 of the lateral wall 128. In the embodiment, the length L3 of each of the first protrusions 122 ranges between 0.3 times and 0.7 times of the length L4 of each of the lateral wall where the first protrusion 122 is located, for example 0.5 times. Certainly, the relationship of the lengths L3 and L4 is not limited thereto.

Referring to FIGS. 3 and 4, the fan frame 120 has at least one recess portion 129 located at an inner side 1202 of the fan frame 120 and corresponds to the at least one first fixing portion 123 located at the outer side 1201 of the fan frame 120. In the embodiment, the fan frame 120 has two recess portions 129, number of the recess portion 129 corresponds to number of the first fixing portion 123, but it is not limited thereto. In the embodiment, a length L5 of each of the recess portions 129 is greater than or equal to the depth L2 of the corresponding first through hole 124.

When the fan frame 120 is assembled to the fan 110, the inner side 1202 of the fan frame 120 contacts the fan 110. In the embodiment, the recess portions 129 located at an inner side 1202 of the fan frame 120 are designed to reduce the contact area between the fan 110 and the fan frame 120 so as to reduce transmission of vibration from the fan 110 to the fan frame 120.

Especially, the recess portions 129 which are the portions without contacting the fan 110 correspond to the first fixing portions 123 which are fixed to the first casing 130, such that vibration of the fan 110 is more difficult to transmit to the first casing 130 through the fan frame 120, and then transmission of the vibration from the fan 110 to the optical engine 160 can be lower.

As shown in Table I below, the fan frame 120 with special design is capable of lowering the vibration of the projection lens 162 along X-axis and Y-axis significantly. In addition, vibration of projection image can be reduced to the values under the standard (pixel shift <0.5).

TABLE I

|  | Conventional fan frame | Fan frame 120 of the embodiment |
|---|---|---|
| Vibration of projection lens 162 along X-axis (mg) | 33 | 17 |
| Vibration of projection lens 162 along Y-axis (mg) | 30 | 15 |
| Pixel shift of X-axis | >0.5 | <<0.5 |
| Pixel shift of Y-axis | 1 | <0.5 |

Figure 6:
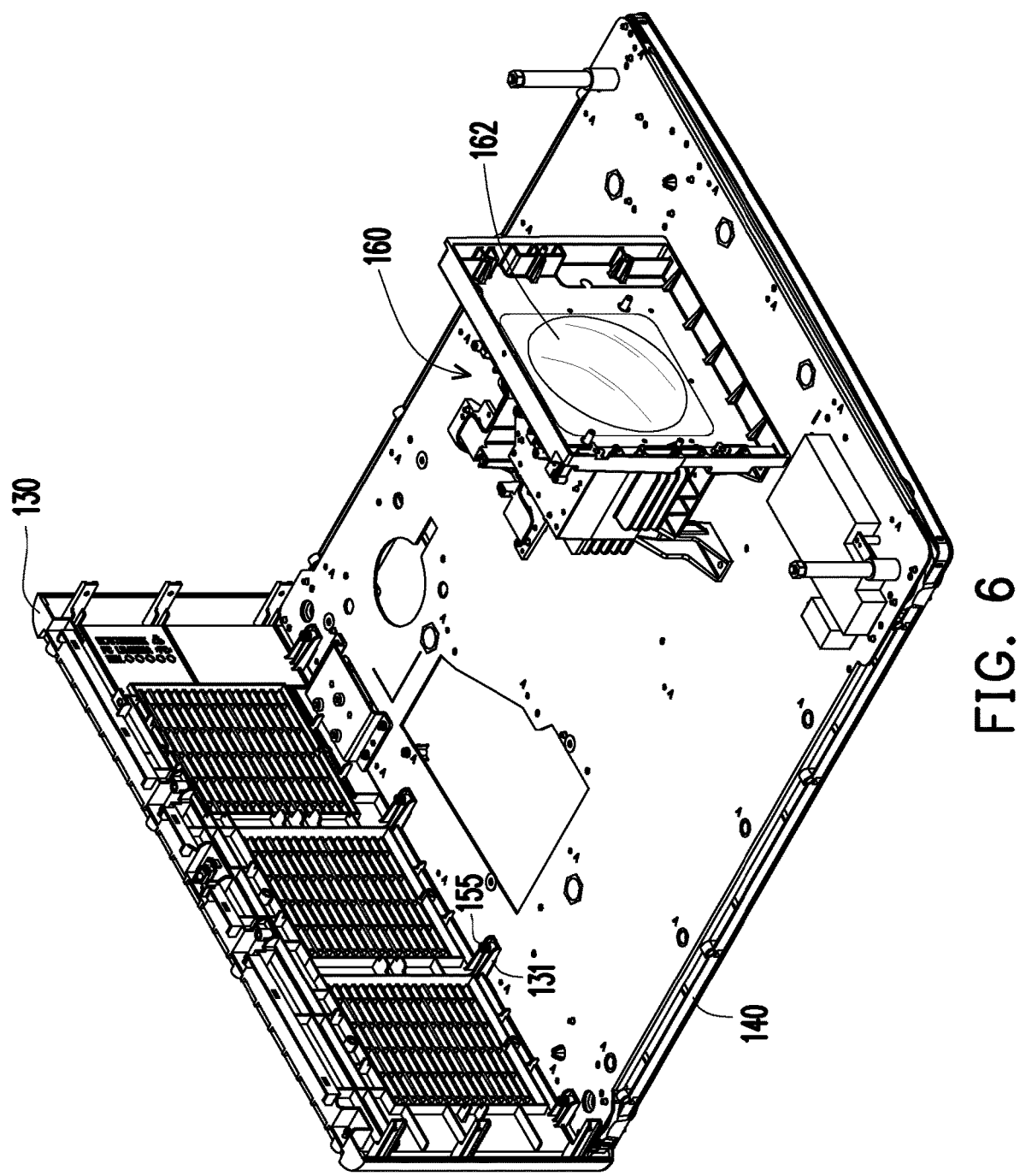
FIG. 6 is a schematic view of the projector of FIG. 1 which the fan and the fan module are hidden.
Figure 7:
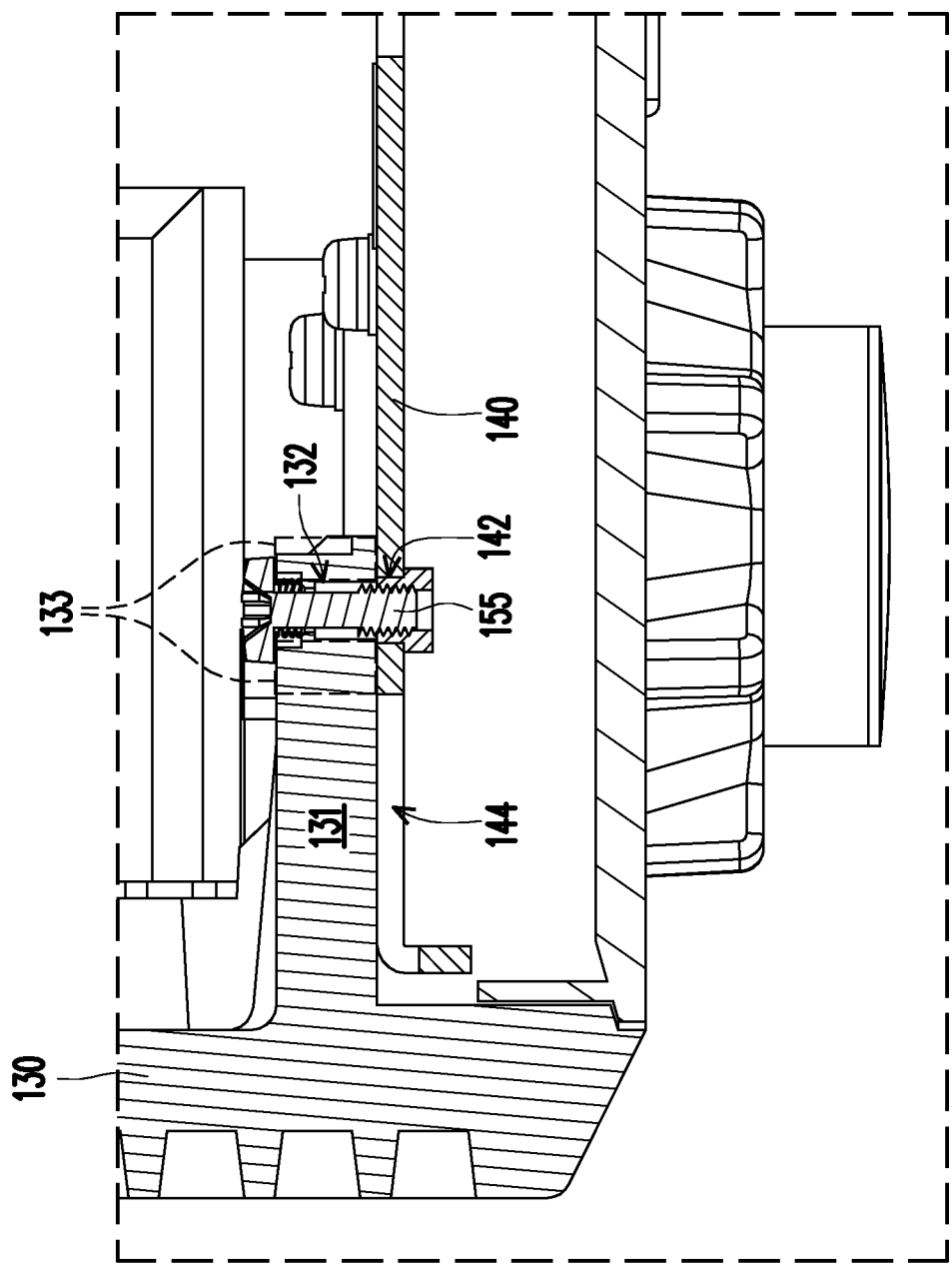
FIG. 7 is a partial cross-sectional view of the projector of FIG. 1.

FIG. 6 is a schematic view of the projector of FIG. 1 which the fan and the fan module are hidden. FIG. 7 is a partial cross-sectional view of the projector of FIG. 1. Referring to FIGS. 6 and 7, in the embodiment, the first casing 130 includes at least one second fixing portion 131 partially and directly contact the second casing 140. In the embodiment, the first casing 130 has four second fixing portions 131, but number of the second fixing portions 131 is not limited thereto.

As shown in FIG. 7, the second fixing portion 131 has a third through hole 132, the second casing 140 has a fourth through hole 142 coaxial to the third through hole 132, a second screw 155 passes through the third through hole 132 and the fourth through hole 142 so that the first casing 130 is fixed to the second casing 140.

Figure 8:
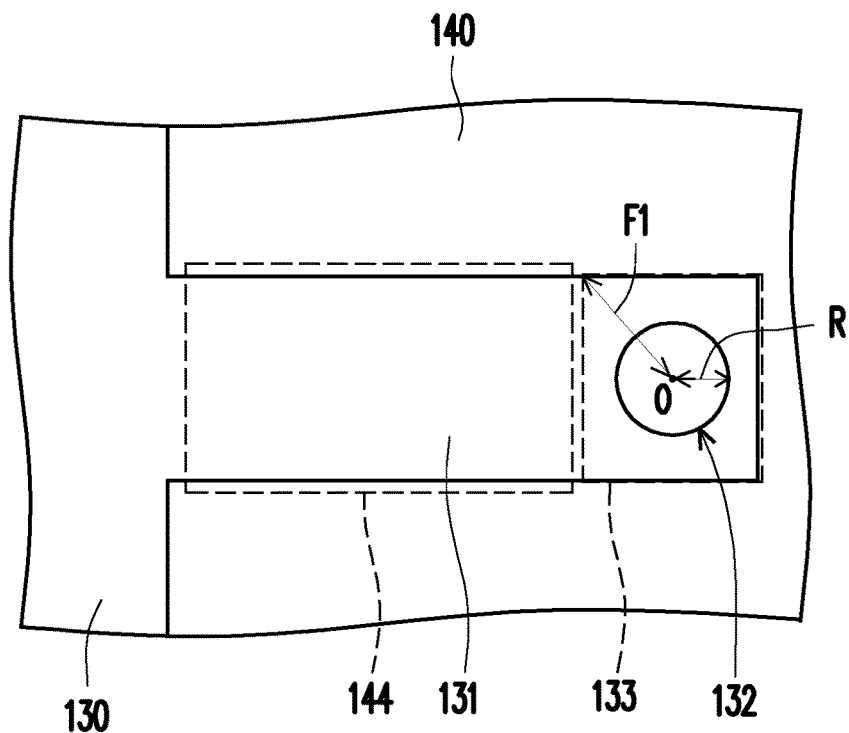
FIG. 8 is a top view of a second fixing portion of the first casing of the projector of FIG. 1.

FIG. 8 is a top view of a second fixing portion of the first casing of the projector of FIG. 1. Referring to FIGS. 7 and 8, the second fixing portion 131 includes a contact region 133 directly contacting the second casing 140. An area of the contact region 133 is less than the area of the second fixing portion 131. In the embodiment, the second casing 140 has an opening 144 corresponding to a part of the second fixing portion 131 out of the contact region 133, such that the part of the second fixing portion 131 does not contact the second casing 140, and the contact region 133 is the only portion of the second fixing portion 131 contacting the second casing 140.

Because the second fixing portion 131 of the first casing 130 partially contacts the second casing 140, transmission of vibration from the first casing 130 to the second casing 140 can be reduced, and then transmission of the vibration from the fan 110 to the optical engine 160 can be lower. As shown in Table II below, the design that the contact area between the second fixing portion 131 of the first casing 130 and the second casing 140 is less than the area of the second fixing portion 131 is capable of lowering the vibration of the projection lens 162 along X-axis and Y-axis significantly. In addition, vibration of projection image can be reduced to the values under the standard (pixel shift <0.5).

TABLE II

|  | Conventional design (the contact area between the fixing portion of the first casing 130 and the second casing 140 is equal to the area of the fixing portion) | The embodiment (the contact area between the second fixing portion 131 of the first casing 130 and the second casing 140 is less than the area of the second fixing portion 131) |
|---|---|---|
| Vibration of projection lens 162 along X-axis (mg) | 8.6 | 4.8 |
| Vibration of projection lens 162 along Y-axis (mg) | 23.1 | 13 |
| Pixel shift of X-axis | 0.5 | <<0.5 |
| Pixel shift of Y-axis | 1 | <0.5 |

In addition, as shown in FIG. 8, in the embodiment, a farthest distance F1 between a center O of the third through hole 132 and one of end points of outline of the contact region 133 is greater than a radius R of the third through hole 132 and less than twice of the radius R of the third through hole 132. According to the simulation result, the dimension relationship of the farthest distance F1 and the radius R above can provide good fixing efficiency and vibration-proof function between the first casing 130 and the second casing 140.

In general, the fan 110 vibrates while it operates, and vibration transmits from the fan 110, the fan frame 120, the first casing 130, the second casing 140 to the projection lens 162 sequentially, such that the image vibration may occur. In the embodiment, the fan frame 120, the first casing 130 and/or the second casing 140 with special design which does not increase volume, weight, cost and/or number of components are capable of reducing transmission of vibration so as to provide better image quality.

Figure 9:
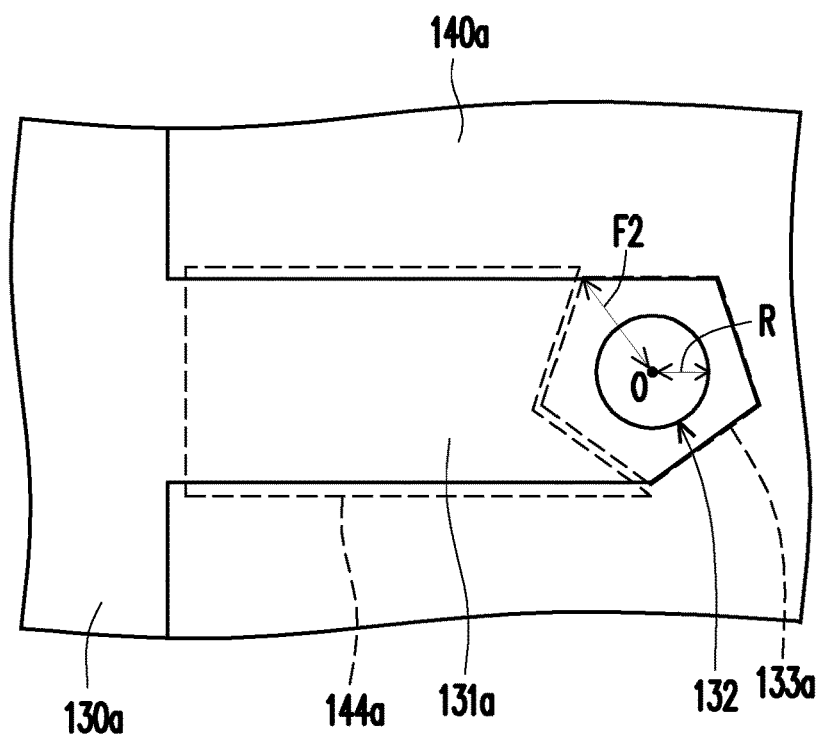
FIG. 9 is a top view of a second fixing portion of a first casing in accordance with an embodiment of the disclosure.

FIG. 9 is a top view of a second fixing portion of a first casing in accordance with an embodiment of the disclosure. Referring to FIG. 9, a main difference between the second fixing portions 131, 131a of FIGS. 8 and 9 is the shapes of the second fixing portions 131, 131a of the first casings 130, 130a. In FIG. 8, the shape of the second fixing portion 131 is rectangle. In the embodiment, the shape of the second fixing portion 131a is pentagon. However, the shape of the second fixing portion 131a is not limited thereto. In other embodiment, the shape of the second fixing portion 131a can be polygon, irregular shape, circle or oval. Accordingly, the shape of the openings 144, 144a of the second casings 140, 140a are different.

In addition, in the embodiment, a farthest distance F2 between a center O of the third through hole 132 and one of end points of outline of the contact region 133a is also greater than a radius R of the third through hole 132 and less than twice of the radius R of the third through hole 132.

Figure 10:
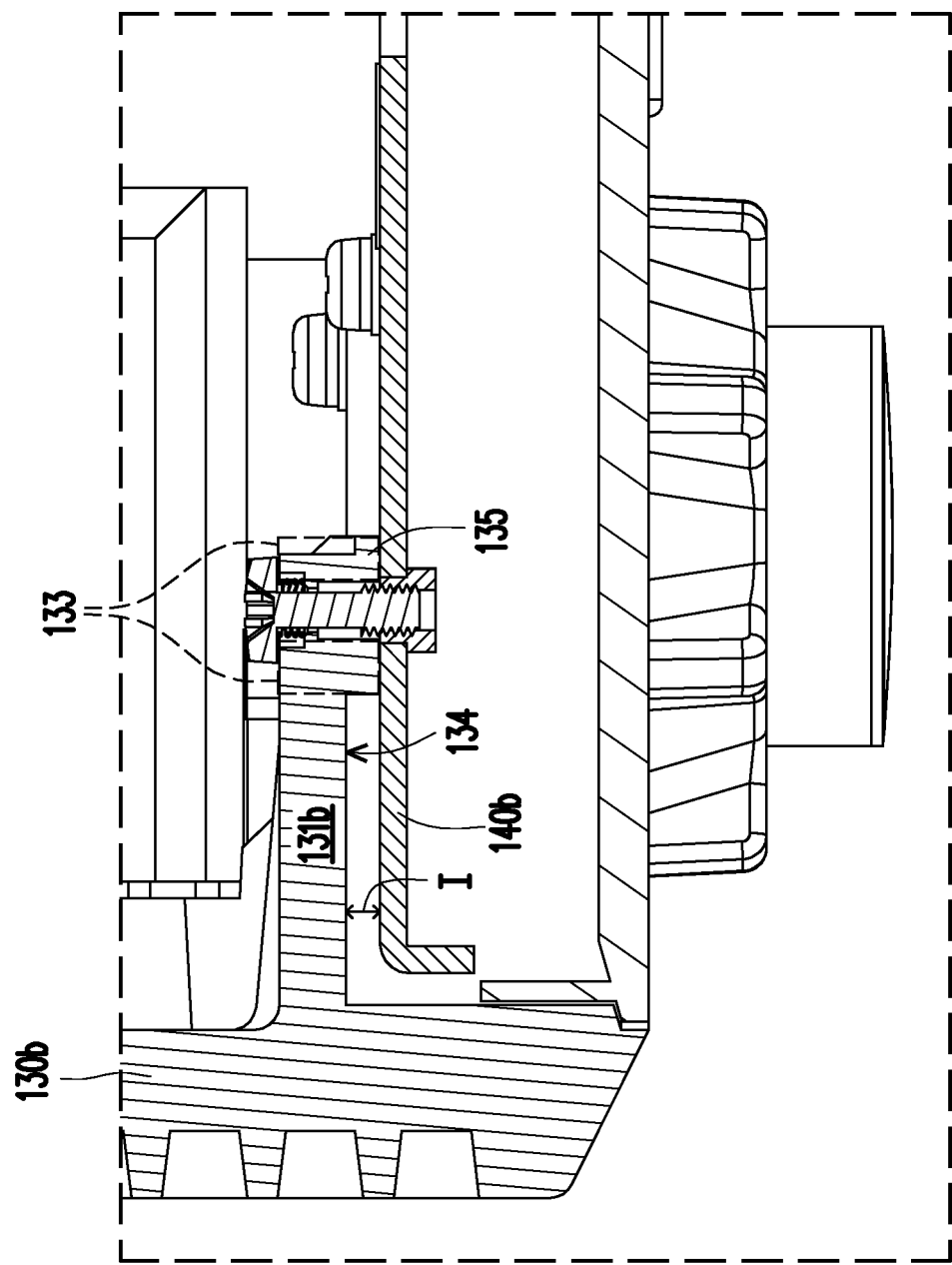
FIG. 10 is a partial cross-sectional view of a projector in accordance with an embodiment of the disclosure.

FIG. 10 is a partial cross-sectional view of a projector in accordance with an embodiment of the disclosure. Referring to FIG. 10, a main difference between FIGS. 7 and 10 is the ways to form the contact region 133. In FIG. 7, the contact region 133 of the second fixing portion 131 is defined by the opening 144 of the second casing 140. In detail, the contact region 133 of the second fixing portion 131 is the region whose projection onto the second casing 140 is located out of the opening 144.

On the other hand, in the embodiment of FIG. 10, the second fixing portion 131b of the first casing 130b includes a third surface 134 facing the second casing 140b and a second protrusion 135 protruding from the third surface 134, so that an interval I is formed between the third surface 134 and the second casing 140b. The second protrusion 135 directly contacts the second casing 140, such that the contact region 133 is located on the second protrusion 135. Certainly, the way to form the contact region 133 is not limited thereto.

Based on the above, in embodiments of the disclosure, the fan is sleeved in the fan frame, the first fixing portion of the fan frame is fixed to the first casing, the first casing is fixed to the second casing, and the projection lens is fixed to the second casing. The fan frame, the first casing and/or the second casing have special design to lower transmission of the vibration from the fan to the optical engine. For example. the two slits are designed to arrange at the two opposite sides of the first fixing portion of the fan frame, and the length of each of the two slits is greater than the depth of the first through hole so as to transmit less vibration of the fan to the first casing.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A projector, comprising:
   a fan;
   a fan frame, the fan being sleeved in the fan frame, wherein the fan frame comprises a first fixing portion having a first through hole, and two grooves located at two opposite sides of the first fixing portion, an extension direction of the two grooves is parallel to an extension direction of the first through hole, and a length of each of the two grooves along the extension direction of the two grooves is greater than a depth of the first through hole along the extension direction of the first through hole;
   a first casing, fixed to the fan frame, wherein a first screw passes through the first through hole and is fixed to the first casing;
   a second casing, fixed to the first casing; and
   a projection lens, fixed to the second casing.

2. The projector according to claim 1, wherein the fan frame has a second through hole located beside the first through hole and corresponding to a screw head of the first screw, and an extension direction of the second through hole is vertical to the extension direction of the first through hole.

3. The projector according to claim 1, wherein the fan frame has a first surface facing the first casing, the first surface partially contacts the first casing.

4. The projector according to claim 1, wherein the fan frame comprises a plurality of lateral walls connected to each other, the fan frame has a first surface facing the first casing and a first protrusion protruding from the first surface and contacting the first casing, the first fixing portion is located at one of the lateral walls, and the first protrusion is located at another one of the lateral walls.

5. The projector according to claim 4, wherein a length of the first protrusion is less than a length of the lateral wall where the first protrusion is located.

6. The projector according to claim 1, wherein the fan frame has a recess portion located at an inner side of the fan frame corresponding to the first fixing portion, a length of the recess portion is greater than or equal to the depth of the first through hole.

7. The projector according to claim 1, wherein the first casing comprises a second fixing portion partially and directly contact the second casing, the second fixing portion has a third through hole, the second casing has a fourth through hole coaxial to the third through hole, a second screw passes through the third through hole and the fourth through hole.

8. The projector according to claim 7, wherein the second fixing portion comprises a contact region directly contacting the second casing, a farthest distance between a center of the third through hole and one of end points of outline of the contact region is greater than a radius of the third through hole and less than twice of the radius of the third through hole.

9. The projector according to claim 8, wherein, the second casing has an opening corresponding to a part of the second fixing portion out of the contact region, such that the part of the second fixing portion does not contact the second casing.

10. The projector according to claim 8, wherein the second fixing portion comprises a third surface facing the second casing and a second protrusion protruding from the third surface, the contact region is located on the second protrusion, and an interval is formed between the third surface and the second casing.

11. The projector according to claim 1, wherein the fan frame is a flexible fan frame, and material of the flexible fane frame is rubber or silicone.

12. A projector, comprising:
    a fan;
    a fan frame, the fan being sleeved in the fan frame, wherein the fan frame comprises a first fixing portion having a first through hole, and two grooves located at two opposite sides of the first fixing portion, an extension direction of the two grooves is parallel to an extension direction of the first through hole, and a length of each of the two grooves is greater than a depth of the first through hole;
a first casing, fixed to the fan frame, wherein a first screw passes through the first through hole and is fixed to the first casing;
a second casing, fixed to the first casing; and
a projection lens, fixed to the second casing,
wherein the fan frame has a first surface facing the first casing and a first protrusion protruding from the first surface and contacting the first casing, and the first protrusion is away from the first fixing portion.

\* \* \* \* \*